(12) United States Patent
Kwon et al.

(10) Patent No.: US 11,023,195 B2
(45) Date of Patent: Jun. 1, 2021

(54) DISPLAY APPARATUS INCLUDING A PLURALITY OF DISPLAY MODULES

(71) Applicant: SAMSUNG ELECTRONICS CO., LTD., Suwon-si (KR)

(72) Inventors: Oh Jae Kwon, Suwon-si (KR); Jin Sung Lee, Suwon-si (KR); Jong Sul Min, Hwaseong-si (KR); Ho Young Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/315,837

(22) PCT Filed: Jun. 21, 2017

(86) PCT No.: PCT/KR2017/006514
§ 371 (c)(1),
(2) Date: Jan. 7, 2019

(87) PCT Pub. No.: WO2018/008875
PCT Pub. Date: Jan. 11, 2018

(65) Prior Publication Data
US 2019/0307016 A1    Oct. 3, 2019

(30) Foreign Application Priority Data

Jul. 7, 2016 (KR) .................. 10-2016-0086244

(51) Int. Cl.
*G06F 3/14* (2006.01)
*H05K 7/18* (2006.01)
(Continued)

(52) U.S. Cl.
CPC .......... *G06F 3/1446* (2013.01); *G02F 1/1333* (2013.01); *G06F 3/14* (2013.01); *G09F 9/302* (2013.01); *H05K 7/18* (2013.01)

(58) Field of Classification Search
CPC ........ G06F 3/1446; G06F 3/14; G02F 1/1333; G09F 9/302; H05K 7/18
See application file for complete search history.

(56) References Cited

U.S. PATENT DOCUMENTS 5,995,179 A * 11/1999 Tamura ................. G09F 9/3026
349/58
7,800,583 B2 * 9/2010 Kato ..................... H01C 10/30
345/157
(Continued)

FOREIGN PATENT DOCUMENTS

KR    10-0371603 B1    2/2003
KR    10-0523603 B1    10/2005
(Continued)

OTHER PUBLICATIONS

International Search Report (PCT/ISA/210) dated Oct. 25, 2017, issued by the International Searching Authority in counterpart International Patent Application No. PCT/KR2017/006514.
(Continued)

*Primary Examiner* — Jinhee J Lee
*Assistant Examiner* — Douglas R Burtner
(74) *Attorney, Agent, or Firm* — Sughrue Mion, PLLC

(57) ABSTRACT

Disclosed is a display apparatus including a plurality of display modules and a frame to detachably mount the plurality of display modules thereon, the frame including guide bars on which the display module includes guide bars are mounted to be movable in a horizontal direction, so that a screen is physically separated or joined.

11 Claims, 8 Drawing Sheets

(51) Int. Cl.
  *G09F 9/302* (2006.01)
  *G02F 1/1333* (2006.01)

(56) References Cited

U.S. PATENT DOCUMENTS

| | | | | |
|---|---|---|---|---|
| 7,864,516 B2* | 1/2011 | Lee | | H05K 5/0204 361/679.21 |
| 8,451,594 B2* | 5/2013 | Kim | | H04N 9/12 361/679.04 |
| 8,614,884 B2* | 12/2013 | Hsu | | F16M 11/22 361/679.22 |
| 8,910,804 B2* | 12/2014 | Kim | | F16M 13/02 211/87.01 |
| 9,311,834 B2* | 4/2016 | Lee | | G06F 3/041 |
| 9,326,620 B1* | 5/2016 | Cross | | A47F 3/001 |
| 9,414,503 B2* | 8/2016 | Lee | | H05K 5/0017 |
| 9,612,004 B2* | 4/2017 | Hemiller | | F21V 21/34 |
| 9,644,823 B2* | 5/2017 | Hemiller | | F21V 21/34 |
| 9,712,780 B2* | 7/2017 | Oya | | F16M 13/02 |
| 9,854,701 B2* | 12/2017 | Choi | | G09F 9/3026 |
| 9,924,604 B2* | 3/2018 | Drabant | | F21V 19/00 |
| 9,936,826 B2* | 4/2018 | Agnoli | | A47F 5/10 |
| 9,998,708 B1* | 6/2018 | Bakshi | | H04N 7/147 |
| 10,104,963 B2* | 10/2018 | Brandt | | F16M 13/02 |
| 10,339,856 B1* | 7/2019 | Norton | | G06F 3/1446 |
| 2005/0253775 A1* | 11/2005 | Stewart | | G06F 1/1616 345/1.1 |
| 2006/0077669 A1* | 4/2006 | Thielemans | | G09F 15/00 362/368 |
| 2006/0082518 A1* | 4/2006 | Ram | | G06F 3/1446 345/1.1 |
| 2006/0268500 A1* | 11/2006 | Kuhn | | G06F 1/1616 361/679.04 |
| 2007/0103386 A1* | 5/2007 | Hara | | G02F 1/133308 345/1.1 |
| 2007/0285343 A1* | 12/2007 | Han | | G06F 1/1637 345/1.3 |
| 2008/0141572 A1* | 6/2008 | Tomich | | G09F 9/3026 40/605 |
| 2009/0309819 A1* | 12/2009 | Elliott | | F21V 21/088 345/82 |
| 2010/0053027 A1* | 3/2010 | Tonnison | | G06F 1/1624 345/1.3 |
| 2010/0090934 A1* | 4/2010 | Elliott | | G06F 3/1446 345/82 |
| 2010/0124006 A1* | 5/2010 | Chang | | G06F 1/1647 361/679.04 |
| 2010/0128423 A1* | 5/2010 | Moscovitch | | F16M 11/14 361/679.01 |
| 2011/0181495 A1* | 7/2011 | Chu | | G09F 9/33 345/1.3 |
| 2012/0224311 A1* | 9/2012 | Sutherland | | G06K 9/00335 361/679.01 |
| 2012/0251072 A1* | 10/2012 | Cope | | G06F 3/1431 386/230 |
| 2013/0293443 A1* | 11/2013 | Seo | | G06F 3/1446 345/1.2 |
| 2014/0259634 A1* | 9/2014 | Cox | | G09F 19/228 29/592.1 |
| 2014/0259824 A1* | 9/2014 | Jurewicz | | G06F 3/1446 40/466 |
| 2014/0268504 A1* | 9/2014 | Carlson | | G06F 3/1446 361/622 |
| 2014/0375529 A1* | 12/2014 | Yun | | G06F 3/1446 345/1.3 |
| 2015/0185791 A1* | 7/2015 | Hall | | G06F 1/183 361/679.21 |
| 2015/0362160 A1* | 12/2015 | Andreasen | | F21V 23/06 362/97.1 |
| 2016/0034240 A1* | 2/2016 | Kreiner | | G09G 5/003 348/383 |
| 2016/0048047 A1* | 2/2016 | Pyo | | G02F 1/133528 349/12 |
| 2016/0140933 A1* | 5/2016 | Pitis | | G06F 3/0484 345/173 |
| 2016/0162245 A1* | 6/2016 | Choi | | G06F 3/1446 345/1.3 |
| 2016/0210886 A1* | 7/2016 | Brashnyk | | G09F 9/33 |
| 2016/0231976 A1* | 8/2016 | Ryu | | G06F 3/1446 |
| 2016/0328203 A1* | 11/2016 | Verlinden | | G09F 19/22 |
| 2017/0006727 A1* | 1/2017 | Ryu | | G09F 9/3026 |
| 2017/0031386 A1* | 2/2017 | Engel | | G06F 3/1446 |
| 2017/0114971 A1* | 4/2017 | Cross | | G09G 5/14 |
| 2017/0249119 A1* | 8/2017 | Ding | | G06F 3/1446 |
| 2018/0039471 A1* | 2/2018 | Yanagisawa | | G06F 3/1446 |
| 2018/0130389 A1* | 5/2018 | Shibata | | G09F 9/40 |
| 2019/0257506 A1* | 8/2019 | Jurewicz | | G09G 3/3648 |

FOREIGN PATENT DOCUMENTS

| | | |
|---|---|---|
| KR | 10-0915118 B1 | 9/2009 |
| KR | 10-2016-0076765 A | 7/2016 |
| KR | 10-1712620 B1 | 3/2017 |

OTHER PUBLICATIONS

Written Opinion (PCT/ISA/237) dated Oct. 25, 2017, issued by the International Searching Authority in counterpart International Patent Application No. PCT/KR2017/006514.
Communication dated Jun. 16, 2020 issued by the State Intellectual Property Office of P.R. China in Chinese Patent Application No. 201780042246.7.
Communication dated Jan. 13, 2021, issued by Intellectual Property India in Indian Patent Application No. 201947004562.
Communication dated Mar. 8, 2021, issued by National Intellectual Property Administration of P.R. China in Chinese Application No. 201780042246.7.

* cited by examiner

DISPLAY APPARATUS INCLUDING A PLURALITY OF DISPLAY MODULES

TECHNICAL FIELD

The present disclosure relates to a display apparatus capable of physically separating and enlarging a screen.

BACKGROUND ART

In display apparatuses, there is a multi-vision including a plurality of display modules. The display modules are arranged in a matrix in the upper, lower, left, and right sides through a frame, and one large screen is formed by the display modules.

However, since the display modules of the display apparatus are fixed on the frame, the screen cannot be physically separated or joined.

Therefore, the conventional display apparatus can only be used to display a large screen, and usage of the display apparatus is limited.

DISCLOSURE

Technical Problem

One aspect of the present disclosure is to provide a display device allowing screens to be physically separated and joined.

Another aspect of the present disclosure is to provide a display device capable of easily enlarging or reducing the screen size.

Technical Solution

It is an aspect of the present disclosure to provide a display apparatus that may include a plurality of display modules, and a frame to detachably mount the plurality of display modules, wherein the frame includes a plurality of guide bars extending in a horizontal direction and vertically spaced apart from each other, with the plurality of display modules being movably installed between the guide bars.

The frame may extend in a vertical direction to maintain the plurality of guide bars in a state of being vertically spaced apart from each other.

The plurality of guide bars may include a plurality of split bars rotatably connected to each other, respectively.

The guide bar may include a rail portion extending in a horizontal direction to movably mount the display module, and the display module includes a guide groove movably installed in the rail portion.

The rail portion may protrude from an upper surface and a lower surface of the guide bar, and the guide groove is recessed on an upper surface and a lower surface of the display module.

The guide bar may include a plurality of terminal parts to transmit power and a signal, and the plurality of display modules include a connection part connected to the terminal parts, respectively.

The display apparatus may further include a camera module detachably mounted in the frame.

The display apparatus may further include a speaker module detachably mounted on the frame.

The display apparatus may further include a motion recognition module detachably mounted on the frame.

It is another aspect of the present disclosure is to provide a display apparatus including a frame, and a plurality of display modules movably installed on the frame in a horizontal direction.

Advantageous Effects

As is apparent from the above, in the display apparatus according to one aspect of the present disclosure, the display modules are movably mounted in the frame, so that the screen may be physically separated or joined.

In addition, the display module according to another aspect of the present disclosure is detachably mounted in the frame, so that the screen size can be adjusted by increasing or decreasing the number of display modules mounted in the frame.

DETAILED DESCRIPTION OF EXEMPLARY EMBODIMENTS

A display device according to a first embodiment of the present disclosure will be described in detail with reference to the figures.

Figure 1:
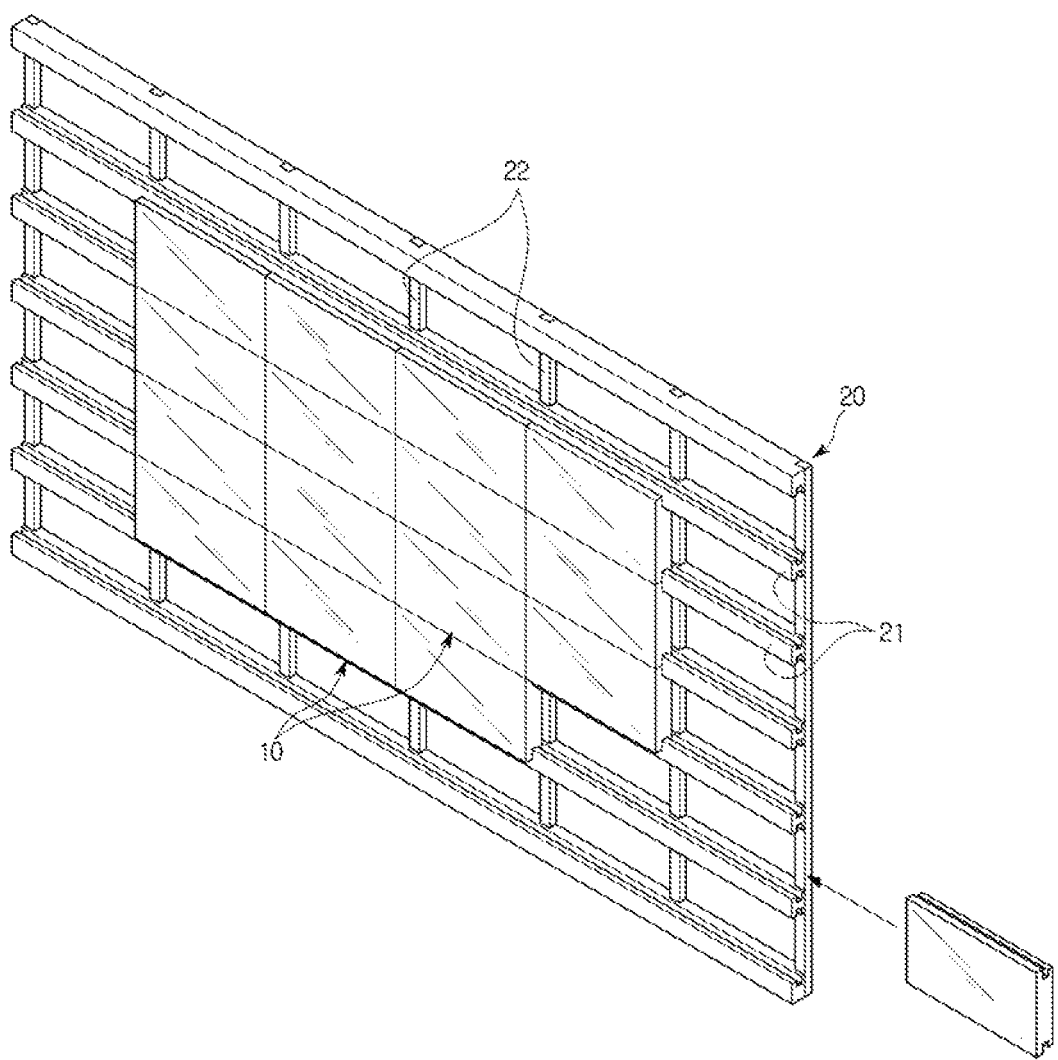
FIG. 1 is a perspective view illustrating a display apparatus according to a first embodiment of the present disclosure.

Referring to FIG. 1, a display apparatus according to a first embodiment of the present disclosure includes a plurality of display modules 10 having a front surface forming a screen, and a frame 20 on which the plurality of display modules 10 are detachably mounted.

The frame 20 includes a plurality of guide bars 21 extending in a horizontal direction and vertically spaced apart from each other, and a plurality of support bars 22 extending in a vertical direction and horizontally spaced apart from each other to maintain the plurality of guide bars 21 in a state of being vertically spaced apart. Therefore, the frame 20 is formed in a substantially grid shape by the guide bars 21 and the support bars 22.

Figure 2:
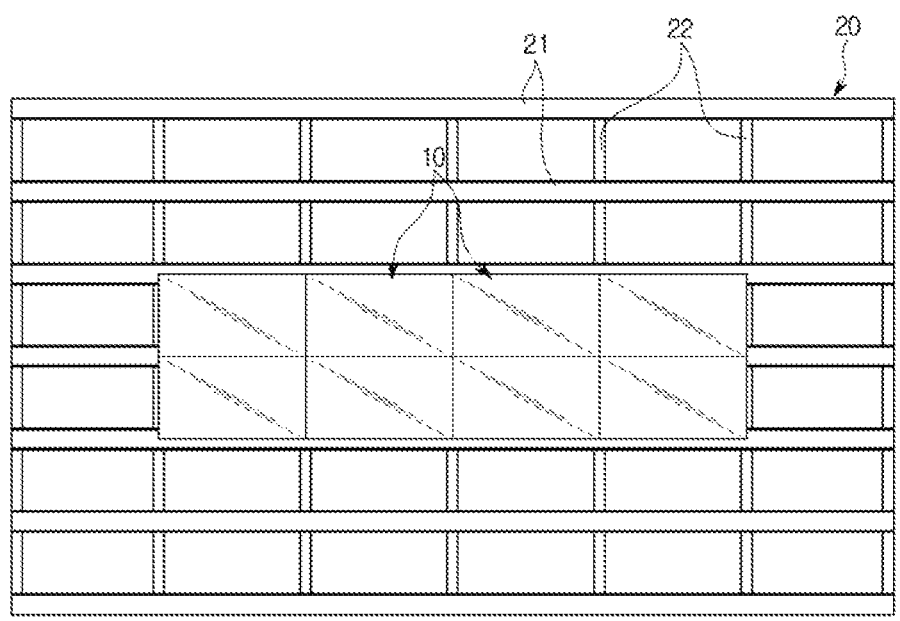
FIG. 2 is a perspective view illustrating a display module installed in a guide bar in the display apparatus according to the first embodiment of the present disclosure.

The guide bar 21 guides a horizontal movement of the display module 10. Referring to FIG. 2, the guide bar 21 has a rail portion 21*a* to which the display module 10 is movably installed, and the display module 10 has a guide groove 10*a* provided concavely and movably installed in the rail portion 21*a*. In this embodiment, the rail portion 21*a* protrudes from an upper surface and a lower surface of the guide bar 21, and the guide groove 10*a* is provided on an upper surface and a lower surface of the display module 10. Accordingly, the display module 10 is movably mounted in a horizontal direction between two of the guide bars 21 that are vertically spaced apart.

The guide bar 21 includes a terminal portion 21*b* to transmit power and a signal such as a video signal to the display module 10. The display module 10 includes a connection part 10*b* connected to the terminal portion 21*b* of the guide bar 21. In this embodiment, a plurality of the terminal portions 21*b* are provided on each of the guide bars 21 so as to correspond to the horizontal movement of the display module 10.

Figure 3:
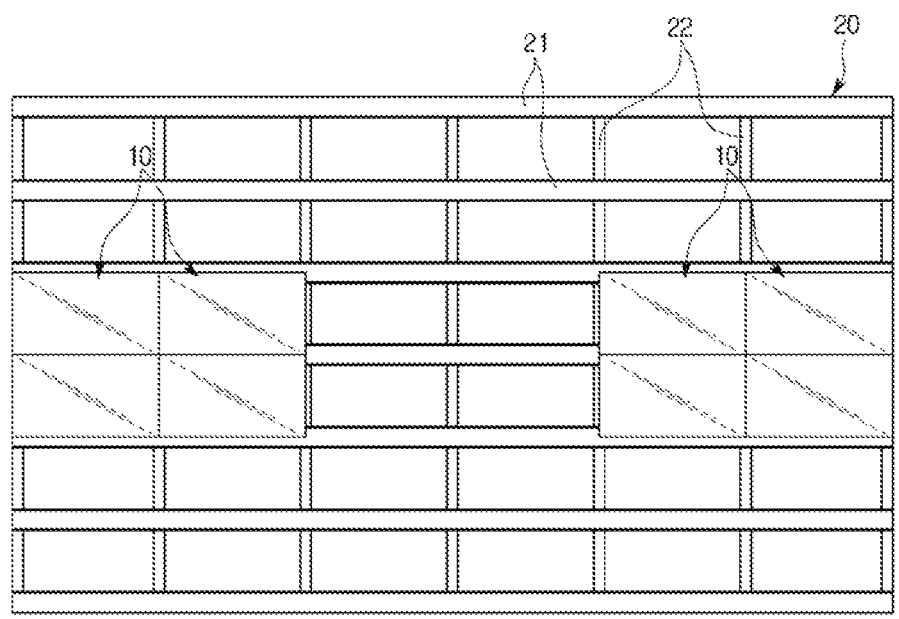
FIG. 3 is a front view illustrating a state in which a plurality of the display modules form a single screen in the display apparatus according to the first embodiment of the present disclosure.
Figure 4:
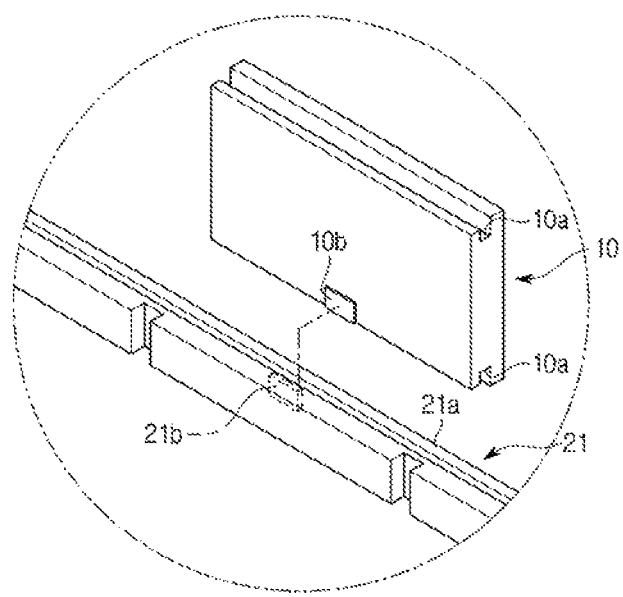
FIG. 4 is a front view illustrating a state in which a plurality of the display modules form two screens in the display apparatus according to the first embodiment of the present disclosure.

Therefore, the display modules 10 may be moved to form one screen as shown in FIG. 3, or the display modules 10 may be moved to form two groups of the display modules 10 so that the display apparatus forms two physically separated screens as shown in FIG. 4. In addition, although the display modules 10 are moved to form two groups in the figures, the present disclosure is not limited thereto. The display modules 10 may be separated into three or more groups. Also, the display modules 10 may be separated from each other so that each of the display modules 10 forms a screen separately.

Accordingly, the display modules 10 may be moved according to a required screen size, screen number and screen shape so that the display apparatus may have various numbers and types of screens. That is, when a large screen is required as in the case of watching a movie, the display modules 10 are joined at a center of the frame 20 so that the display modules 10 form one screen like a multi-vision. And when two or more screens are required at the same time, the display modules 10 are moved to form a plurality of screens so that the display apparatus may be used as a screen for a game machine or an electronic frame.

Also, the display modules 10 are detachably mounted on the frame 20 so that the display modules 10 are attached or detached to adjust the number of the display modules 10 installed on the frame. Thereby, the screen size of the display apparatus is easily enlarged or reduced.

In this embodiment, the guide bars 21 are formed in a single bar shape. However, referring to FIGS. 5 and 6 which illustrate a second embodiment of the present disclosure, the guide bars 21 may be formed by a plurality of split bars 21-1 which are rotatably coupled to each other. When the guide bars 21 are formed by the split bars 21-1, the frame 20 can be rotated about coupling portions of the split bars 21-1, so that the frame 20 may be folded. In this embodiment, each of the guide bars 21 is formed with six split bars, and the split bars 21-1 are connected to each other at five positions. Therefore, the guide bar 21 may be folded around the five positions.

Figure 5:
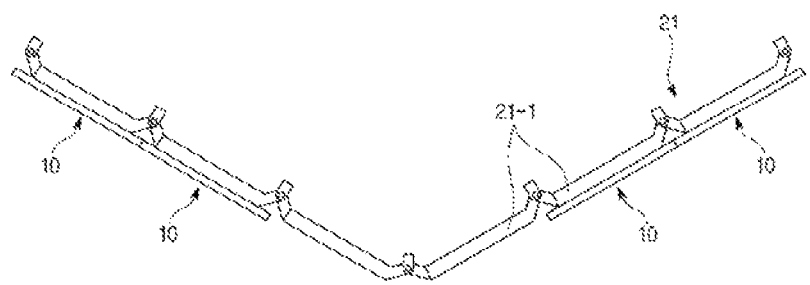
FIG. 5 is a plan view illustrating a state in which opposite sides of a guide bar are moved backward from a center to a rear side in a display apparatus according to a second embodiment of the present disclosure.
Figure 6:
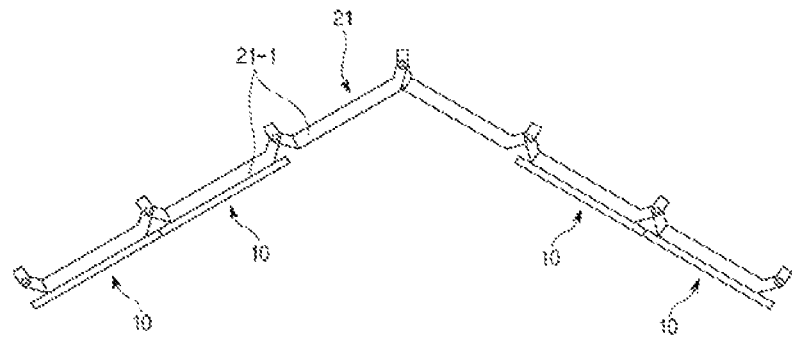
FIG. 6 is a plan view illustrating a state in which opposite sides of the guide bar are advanced forward from the center to a front side in the display apparatus according to the second embodiment of the present disclosure.

Referring to FIG. 5, when the guide bars 21 are deformed such that opposite sides of the frame 20 protrude rearward from a center portion of the frame, two users may see two separate screens. Referring to FIG. 6, when the guide bars 21 are deformed such that opposite sides of the frame 20 protrude forward from the center portion of the frame, one user may see two screens simultaneously.

Also, although not shown in the figures, the guide bars 21 may rotate about another coupling portion of the split bars 21-1 as well as the center portion of the frame.

Figure 7:
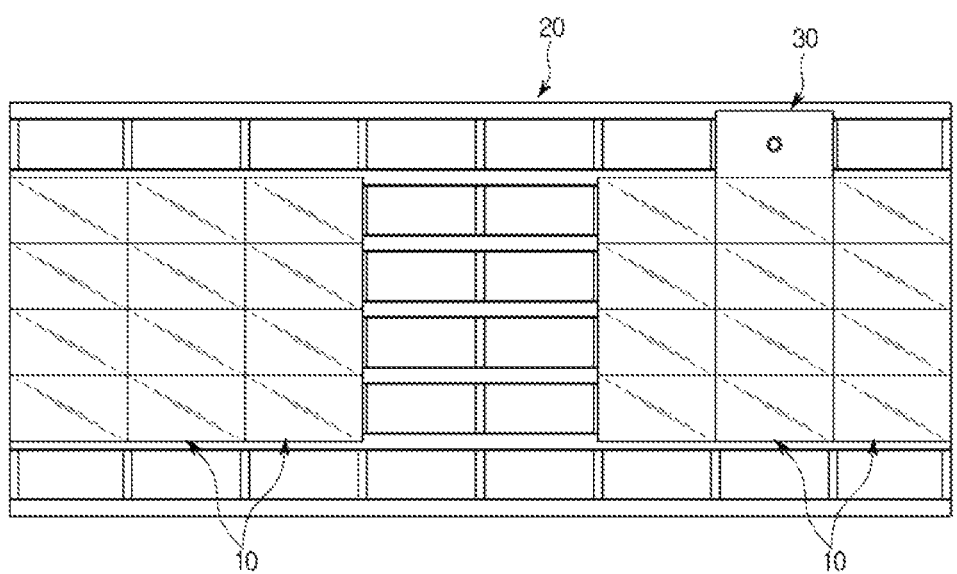
FIG. 7 is a front view illustrating a display apparatus according to a third embodiment of the present disclosure.

In the above embodiments, the display apparatus includes only the display modules 10 and the frame 20, but the present disclosure is not limited thereto. Referring to FIG. 7 illustrating a third embodiment of the present disclosure, a display apparatus includes a camera module 30 detachably mounted on the frame 20.

In this embodiment, the camera module 30 is disposed on an upper side of the display modules and is movably mounted on the frame through the guide bars 21 in the horizontal direction the same manner as the display modules 10. Accordingly, the camera module 30 may be changed in position vertically or horizontally as required by the user in the same manner as the display modules 10.

As described above, in the display apparatus including the camera module 30, the display module 10 forms two screens as shown in the figures. One side screen displays a picture to be desired by the user and the other side screen displays an appearance of the user photographed through the camera module 30. Accordingly, the user may follow an exercise motion displayed on the one side screen while checking the user's exercise posture through the other screen.

Figure 8:
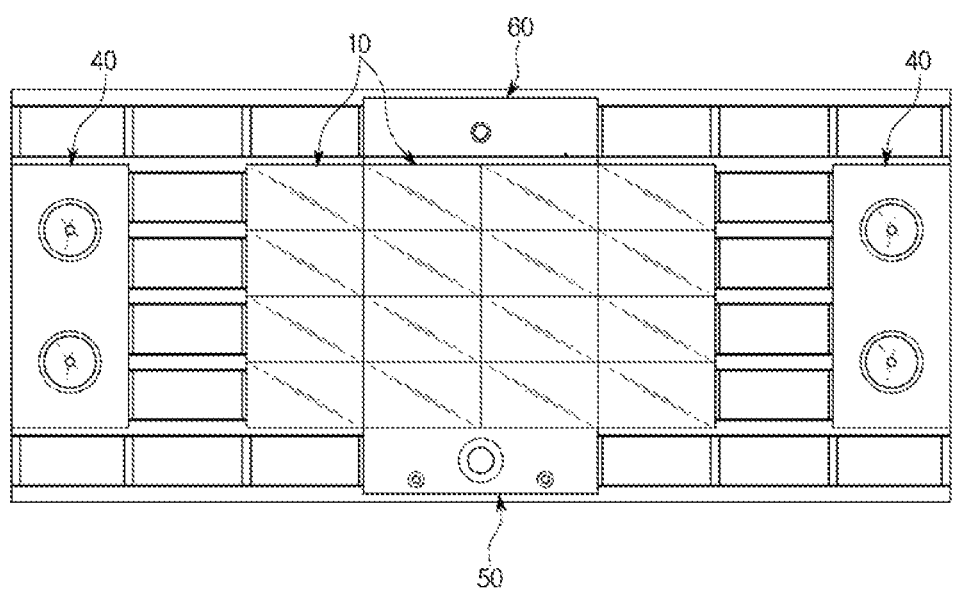
FIG. 8 is a front view illustrating a display apparatus according to a fourth embodiment of the present disclosure.

Referring to FIG. 8 illustrating a fourth embodiment of the present disclosure, a display apparatus may further include speaker modules 40 and 50 and a motion recognition module 60 that are detachably mounted in the frame 20.

In this embodiment, the speaker modules 40 and 50 include two of the tweeter speaker modules 40 disposed on the left and right sides of the display modules 10 and the woofer speaker module 50 disposed below the display modules 10.

The motion recognizing module 60 recognizes a motion of the user located on a front side of the display apparatus and may control a function of the display apparatus according to the motion of the user.

The speaker modules 40 and 50 and the motion recognition module 60 are mounted to be movable in the horizontal direction to the frame 20 through the guide bar 21 the same manner as the display modules 10, so that the speaker modules 40 and 50 and the motion recognizing module 60 can change positions as required by the user the same manner as the display modules 10.

Although not shown in the figures, the display apparatus may include a video playback module to play back images such as a CD, a DVD, and a Blu-ray Disc, or a game module to drive a game, and the like.

In this embodiment, the display module 10 is movably mounted between two of the guide bars 21 that are vertically adjacent to each other, and the upper surface and the lower surface of the display module 10 are supported by the two guide bars 21. Although not shown in the figures, a display module may be movably mounted through one guide bar or may be movably installed through three or more guide bars.

In this embodiment, the rail portion 21*a* protrudes from the guide bar 21 and the guide groove 10*a* is provided in the display module 10. However, the present disclosure is not limited thereto. It is also possible that the guide grooves are provided in the guide bar and the guide portion is protruded from the display module.

The present disclosure is not limited to the embodiments described above, and it should be clear to those skilled in the art that various changes and modifications thereto are possible without departing from the spirit and scope of the present disclosure. Therefore, the changes and modifications fall within the scope of the appended claims of the present disclosure.

The invention claimed is:

1. A display apparatus comprising:
a plurality of display modules, each display module of the plurality of display modules having a front side facing a first direction, an upper side and a lower side; and
a frame configured to detachably mount the plurality of display modules thereon,
wherein the frame includes a plurality of guide bars extending in a horizontal direction and spaced apart from each other in a vertical direction such that each of the plurality of display modules is movably installed between two guide bars among the plurality of guide bars,
wherein each of the plurality of guide bars includes an upper side and a lower side,
wherein the upper side of the each display module is movably connected to a lower side of one guide bar among the plurality of guide bars and the lower side of the each display module is movably connected to an upper side of another guide bar adjacent to the one guide bar among the plurality of guide bars such that the each display module is movable between the one guide bar and the other guide bar in the horizontal direction, and
wherein the first direction is perpendicular to both the horizontal direction and the vertical direction, and
wherein each guide bar of the plurality of guide bars includes a first rail portion protruding from the upper side of the each guide bar in the vertical direction and extending in the horizontal direction to movably mount the plurality of display modules thereon, and
wherein a display module of the plurality of display modules includes a first guide groove on a lower side of the display module and movably installed in the first rail portion, the upper side of the each guide bar facing the lower side of the display module.

2. The display apparatus according to claim 1, wherein the frame includes a plurality of support bars extending in the vertical direction to maintain the plurality of guide bars in a state of being vertically spaced apart from each other.

3. The display apparatus according to claim 1, wherein each guide bar of the plurality of guide bars includes a plurality of split bars rotatably connected to each other.

4. The display apparatus according to claim 1, wherein each guide bar of the plurality of guide bars includes a second rail portion extending in the horizontal direction and protruding from the lower side of the each guide bar,
wherein the first guide groove is recessed on the lower side of the display module, and
wherein the display module includes a second groove recessed on an upper side of the display module opposite to the lower side of the display module, the upper side and the lower side of the display module facing opposite directions to each other.

5. The display apparatus according to claim 1, wherein each guide bar of the plurality of guide bars includes a plurality of terminal parts to transmit power and a signal, and
wherein each of the plurality of display modules includes a connection part connected to a terminal part of the plurality of terminal parts.

6. The display apparatus according to claim 1, further comprising a camera module detachably mounted in the frame.

7. The display apparatus according to claim 1, further comprising a speaker module detachably mounted on the frame.

8. The display apparatus according to claim 1, further comprising a motion recognition module detachably mounted on the frame.

9. The display apparatus according to claim 1, wherein each of the plurality of display modules has a rear side facing a second direction opposite to the first direction, the second direction being perpendicular to both the horizontal direction and the vertical direction.

10. The display apparatus according to claim 1, wherein the plurality of display modules are formed by a first group of display modules and a second group of display modules, the first group and the second group being separated so that each of the first group and the second group forms a screen.

11. The display apparatus according to claim 2, wherein the frame is in a grid shape formed by the plurality of guide bars and the plurality of support bars.

* * * * *